United States Patent [19]

Lafferty

[11] Patent Number: 4,600,902

[45] Date of Patent: Jul. 15, 1986

[54] COMPANDOR NOISE REDUCTION CIRCUIT

[75] Inventor: Stephen H. Lafferty, Norcross, Ga.

[73] Assignee: Wegener Communications, Inc., Atlanta, Ga.

[21] Appl. No.: 510,010

[22] Filed: Jul. 1, 1983

[51] Int. Cl.[4] .............................................. H04B 1/64
[52] U.S. Cl. ..................................... 333/14; 328/165; 455/72
[58] Field of Search .......................... 333/14; 381/106; 455/72; 330/136, 149; 328/165

[56] References Cited

U.S. PATENT DOCUMENTS

| Re. 30,468 | 12/1980 | Dolby et al. |
|---|---|---|
| 2,173,472 | 9/1939 | Doba . |
| 2,287,077 | 6/1942 | Abraham ........................... 333/14 |
| 2,358,045 | 9/1944 | Barney . |
| 2,407,259 | 9/1946 | Dickieson . |
| 2,817,715 | 12/1957 | Blake . |
| 3,681,618 | 8/1972 | Blackmer . |
| 3,714,462 | 1/1973 | Blackmer . |
| 3,789,143 | 1/1974 | Blackmer . |
| 3,903,485 | 9/1975 | Dolby . |
| 3,978,409 | 8/1976 | Dolby et al. |
| 4,048,443 | 9/1977 | Crochiere et al. |
| 4,353,035 | 10/1982 | Schroder . |

Primary Examiner—Paul Gensler
Attorney, Agent, or Firm—Dale Lischer; J. Rodgers Lunsford, III

[57] ABSTRACT

There is disclosed an analog signal processing circuit (compandor) and a method for overcoming noise in a transmission medium by means of a composite compressor and composite expander. The composite compressor splits the frequency spectrum of the analog signal into two or more frequency components, compresses all of the frequency components in parallel with the same 3:1 integer compression ratio, combines the compressed frequency components to produce a compressed analog signal, and transmits the compressed analog signal on the transmission medium. The composite expander reconstructs the original analog signal by means of feedback loop which extracts one of the compressed frequency components from the compressed analog signal, expands that extracted compressed frequency component to produce an expanded frequency component, derives the other expanded frequency components from the first expanded frequency component, compresses the derived expanded frequency components which are used to extract the first compressed frequency component, and a combining circuit which combines the expanded frequency components to reconstruct the original analog signal.

17 Claims, 7 Drawing Figures

COMPANDOR NOISE REDUCTION CIRCUIT

BACKGROUND OF THE INVENTION

This invention relates generally to signal processing methods and circuits for overcoming noise inherent in a transmission or recording medium and more particularly concerns compandors comprising composite compressors and composite expanders for achieving that result.

Satellite linked communication networks have come into wide use within the past several years for cable television, security systems, private video and audio communications, and for numerous other purposes. In satellite linked cable television distribution, for example, additional subcarriers are often provided within various video channels in order to carry high fidelity, stereophonic audio signals to cable subscribers. Multiplexing techniques are used with the additional subcarriers to increase the amount of information carried by each subcarrier. In such satellite linked communication networks, the noise inherent in the radio transmission link or medium between the ground station and the satellite must be overcome if high quality service is to be provided to the subscribers.

Compressors and expanders (compandors) have been used with satellite radio links to overcome the effects of noise in the satellite radio link. Compandors can also be used to reduce the subcarrier bandwidth required for FM transmission by allowing a reduction in the frequency deviation of the transmitted signal.

Compressors at the transmitter end of the radio link over-amplify the low amplitudes of a normal analog signal and under-amplify the high amplitudes of the normal analog signal. In the resulting compressed analog signal, the over-amplified low amplitude signals thus can overcome the noise on the transmission medium while the under-amplified high amplitude signals do not overload the transmission medium. Expanders at the receiver end of the radio link reverse the compression process by over-amplifying the high amplitude signals and under-amplifying the low amplitude signals to reconstruct the normal analog signal.

The prior art discloses various noise supression and reduction systems using compandors. U.S. Pat. No. 2,173,472 to Doba discloses dividing the normal analog signal into two or more frequency bands or frequency components, compressing each band separately, transmitting each band over a separate transmission medium, expanding each band separately and then recombining the two bands to reconstitute the original analog signal. The use of two transmission media, one for each frequency band, is impractical for satellite radio links. Moreover, a gain error in either transmission medium will produce a frequency response error at the receiver end expander.

In order to use a single transmission medium, U.S. Pat. No. 2,358,045 to Barney discloses a system like Doba's except the Barney system uses tandem or series connected compressors and expanders, one for the high frequency band followed by one for the low frequency band. In the Barney system, a gain error in the transmission medium will still, like Doba, produce a frequency response error at the receiver end.

In a compandor system such as Doba or Barney, a frequency response error results from a gain error in the transmission medium because the compressor provides a family of frequency response curves having a different response for each amplitude of input signal. The expander also provides a complementary family of frequency response curves having a different response for each amplitude of input signal. If a gain error occurs during transmission in such a system, the input signal at the expander is shifted in amplitude, and the expander operates on a frequency response curve that is not the complement of the compressor's frequency response curve that produced the compressed signal in the first place. Therefore, a frequency response error results from the gain error in the transmission medium where only one frequency component of the normal signal is compressed for transmission (Doba) or where both frequency components of the normal signal are compressed in series (Barney) so that the frequency response errors do not cancel out.

Other prior art compandor systems, including that sold by the assignee of the present invention, compress only the high band signal and transmit the low band signal without being compressed. Such systems, like Doba and Barney, will experience frequency response errors where there is a gain error in the transmission medium. As a result, in such systems the compression ratio has been limited to avoid frequency response errors with the accompanying sacrifice in noise suppression due to the lower compression ratio.

At least one prior art compandor system compresses the whole frequency spectrum with a single compressor in an effort to eliminate frequency response errors resulting from gain errors. Such an approach, however, may experience unwanted audible noise modulation effects.

SUMMARY OF THE INVENTION

It is a principal object of the present invention to provide an analog signal processing circuit (compandor) and method for overcoming noise in a transmission medium which avoids frequency response errors resulting from gain errors in the transmission medium and avoids noise modulation effects during transmission.

The principal object of the present invention is achieved by splitting the frequency spectrum of the normal analog signal into two or more frequency components, compressing all the frequency components in parallel with the same integer compression ratio, combining the compressed frequency components, transmitting the resulting compressed analog signal, receiving the compressed analog signal, extracting one of the compressed frequency components from the compressed analog signal, expanding that compressed frequency component using an integer expansion ratio, deriving the other uncompressed frequency components from the first expanded frequency component, compressing the derived uncompressed frequency components with an integer compression ratio, using the resulting compressed frequency components to extract the first compressed frequency component, and combining the uncompressed frequency components to reconstruct the original analog signal.

It is a further object of the present invention to provide a composite compressor and method for compressing an analog signal by separating a high frequency component of the signal from low frequency components of the signal by means of a summing circuit and frequency selective elements in a feedback loop, compressing the high and low frequency components in parallel by an integer compression ratio by means of integer compressors, and recombining the compressed frequency components by means of a summing circuit for transmission.

It is also an object of the present invention to provide a composite expander and method for expanding a compressed analog signal by extracting a compressed high frequency component from the compressed analog signal by means of a summing circuit, expanding that compressed high frequency component by means of an integer ratio expander, deriving uncompressed low frequency components from the expanded high frequency components by means of frequency selective elements, compressing the derived low frequency components by means of integer compressors to produce compressed low frequency components which are connected via a feedback loop to the summing circuit for extracting the compressed high frequency component, and combining the resulting expanded high frequency component and low frequency components by means of a summing circuit to reconstruct the original analog signal.

It is also an important object of the present invention to provide a composite compressor and expander which are virtually congruent in their structure.

Other objects and advantages of the invention will become apparent on reading the detailed description of the invention.

DETAILED DESCRIPTION OF THE INVENTION

While the invention will be described in connection with a preferred embodiment, it will be understood that I do not intend to limit the invention to that embodiment. On the contrary, I intend to cover all alternatives, modifications, and equivalents as may be included within the spirit and scope of the invention as defined by the apprehended claims.

Figure 1:
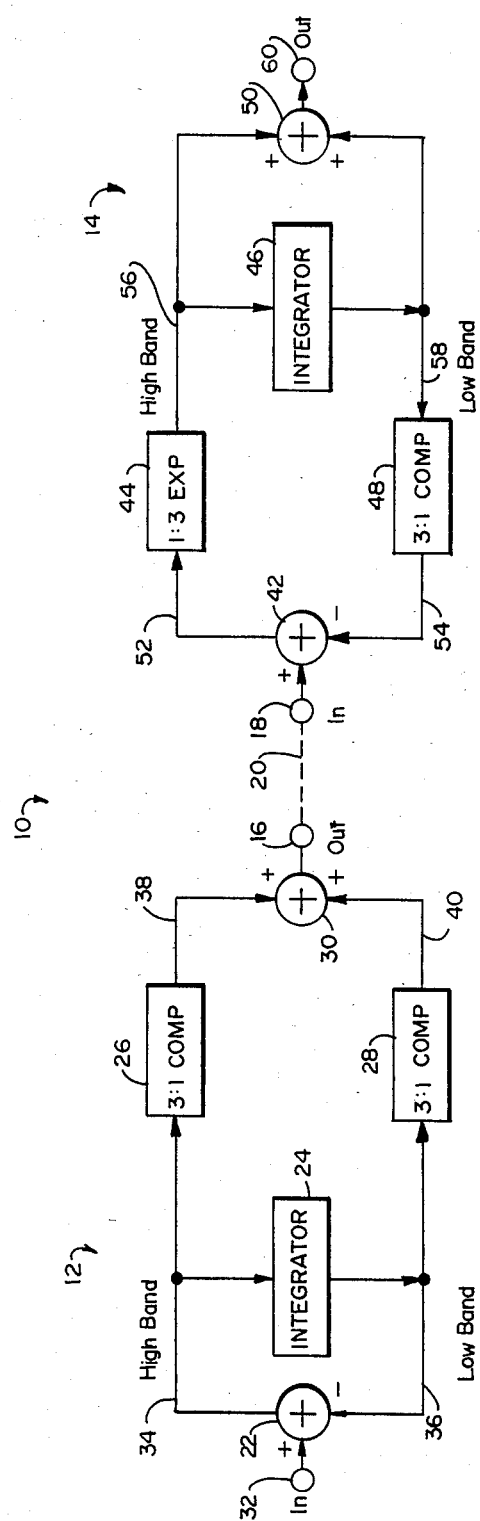
FIG. 1 is a block diagram of a compandor which splits the frequency spectrum of the analog signal into two frequency components and which embodies the present invention.

An analog signal processing circuit or compandor 10, shown in FIG. 1, comprises a composite compressor 12 and a composite expander 14. The composite compressor 12 is connected to the transmit end 16 of a transmission medium 20, and the composite expander 14 is connected to the receive end 18 of the transmission medium 20.

The transmission medium 20 may take a number of forms including coaxial cables, microwave links, radio links, or others. All such transmission media have inherent noise signals which tend to mask or destroy the useful information to be transmitted. For the purpose of the present discussion, but not by way of limitation, the transmission medium of interest is a satellite radio link between a satellite in stationary orbit and a ground station. Such radio links as previously described can be used as part of a cable television network. Moreover, as previously described the television channels may have subcarriers added to provide increased services to subscribers including high fidelity audio services. Where satellite radio links are used to transmit audio analog signals on subcarriers within the television signal spectrum, the satellite link typically has about 35 db signal-to-noise ratio. Because of that low signal-to-noise ratio it is necessary to take precautions to overcome the noise and protect the audio signal.

Audio analog signals are usually transmitted over the transmission medium 20 as FM signals. As a result, the required bandwidth for a particular subcarrier depends on the amplitude range of the analog signal being transmitted. The greater the fluctuation in amplitude is, the wider the bandwidth needs to be. The compandor 10, as well as prior art compandors, provides a way to overcome both problems namely suppressing the effect of noise and limiting the bandwidth by limiting the amplitude variation of the analog signal.

The compandor 10 in accordance with the principles of the present invention also overcomes the problems of frequency response errors resulting from a gain error in the transmission medium 10 and audible noise modulation effects, which problems are not effectively overcome by the prior art.

The composite compressor 12 comprises an input summing circuit 22, an integrator 24 in a feedback loop, two identical 3:1 integer compressors 26 and 28, and an output summing circuit 30. An analog signal is connected to input 32 of the input summing circuit 22. The analog signal for the purposes of discussion is assumed to be an audio analog signal having a full audio frequency spectrum. In the input summing circuit, the high frequency component of the analog signal is extracted (and made available on line 34) by subtracting the low frequency component of the analog signal (on line 36) from the analog signal. The high frequency component is then integrated by integrator 24 to produce the low frequency component on line 36, which low frequency component is fed back and used in the input summing circuit to extract the high frequency component. The integrator 24 is the only frequency element used in separating the high frequency component and the low frequency component. As a result, the high and low frequency components overlap at the −3 db point of their respective frequency response curves.

Figure 4:
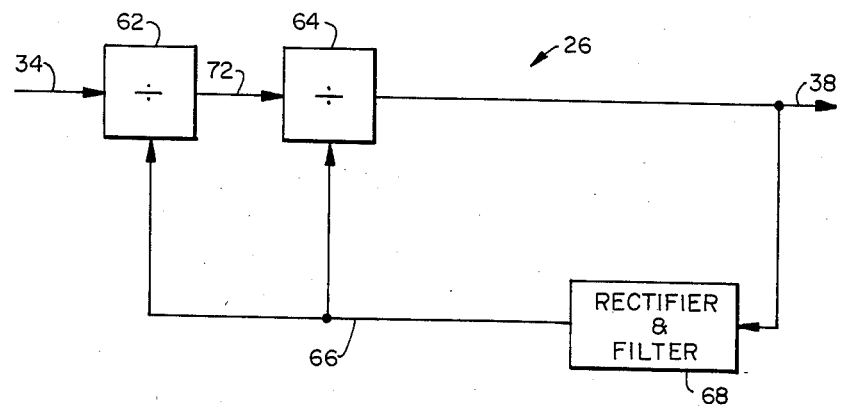
FIG. 4 is a block diagram of an integer (3:1) compressor circuit used in the composite compressors of FIGS. 1, 2, and 3.

Once the high and low frequency components have been isolated on lines 34 and 36 respectively, both signals are compressed in parallel by identical 3:1 integer compressors 26 and 28. The compressors 26 and 28 are constructed as shown in FIG. 4 and will be described in greater detail below. The integer compressors provide an input to output transfer curve (expressed in db) having a slope of 3 to 1. As a result the low level signals are over-amplified and the high level signals are under-amplified in accordance with the 3:1 compression ratio.

The compressed high frequency component on line 38 and the compressed low frequency component on line 40 are then summed by output summing circuit 30 to provide a compressed analog signal at output 16, the transmit end of the transmission medium. It should be understood, of course, that the transmission medium includes the necessary and well known modulators, transmitters, receivers, and demodulators which for clarity have not been shown.

The composite expander 14, which is connected to the receive end 18 of the transmission medium, serves to expand the compressed analog signal back to its original form. Because the compressed analog signal is the sum of the compressed high and low frequency components, expanding the compressed analog signal in accordance with the present invention requires reconstructing each of the frequency components generated in the composite compressor, namely the compressed high and low frequency components and the expanded high and low frequency components.

In order to reconstruct each of the frequency components generated in the composite compressor, the composite expander 14 must be essentially congruent in its structure to the composite compressor 12. The composite expander 14 thus comprises an input summing circuit 42, an integer 1:3 expander 44, an integrator 46, and an integer 3:1 compressor 48, all in a feedback loop, and an output summing circuit 50.

The compressed analog signal is received at the receive end 18 of the transmission medium and connected to the input of the input summing circuit 42. The input summing circuit 42 extracts the compressed high frequency component (on line 52) from the compressed analog signal (at input 18) by subtracting the compressed low frequency component (on line 54) from the compressed analog signal. The compressed high frequency component (on line 52) is then expanded by an integer 1:3 expander 44 which is shown in greater detail in FIG. 5 and will be more fully discussed below. The expanded high frequency component is available at output (line 56) of the expander 44. The expanded high frequency component on line 56 is then integrated by integrator 46 to produce the expanded low frequency component on line 58. In turn the expanded low frequency component on line 58 is compressed by an integer 3:1 compressor 48 to produce the compressed low frequency component on line 54 which is fed back by line 54 to the input summing circuit 42 to be used for extracting the compressed high frequency component as previously described.

Once the expanded high and low frequency components have been generated on lines 56 and 58 respectively, those signals are summed by output summing circuit 50 to reconstitute the original analog signal on output 60 which is the same as the analog signal on input 32.

By splitting the analog signal into two frequency components which span the complete frequency spectrum of interest and compressing both frequency components in parallel using the same compression law, gain variation in the transmission medium affects only the overall gain of the system, not the frequency response of the system. Also independent parallel companding each frequency component minimizes variations in apparent noise in one band due to signal changes in the other band.

A 3:1 compression law is selected to provide certain further advantages. Conventional compandors, which compand only a portion of the frequency spectrum of a signal, have been limited to less than a 3:1 companding ratio because a higher companding ratio would exacerbate the problems associated with frequency response error resulting from a gain error in the transmission medium. By using the higher 3:1 compression ratio in the present invention, the compandor 10 can provide a higher degree of noise rejection in the system. As previously stated, the typical signal-to-noise ratio for a satellite radio link is 35 db. By using a 2:1 companding ratio, the signal-to-noise ratio can be raised to 70 db. By using a 3:1 companding ratio, the signal-to-noise ratio can be increased to nearly 90 db.

Because gain error in the transmission medium does not create a frequency response error at the composite expander of the present invention, a higher compression ratio than 2:1 can be used. Particularly, it has been found that a 3:1 integer compression ratio appears to be optimum. While one might consider the possibility of using a higher compression ratio, such a higher compression ratio does not provide significant advantages in that a 90 db signal-to-noise ratio produced by a 3:1 compression ratio is at the limit of the capability of the human ear.

Having determined that a compression ratio of about 3:1 is advantageous, an integer compression ratio offers further advantages because it assures that the compression ratio remains virtually the same for each compressor (or expander) that is used in the system. In some prior art compandors, the compression ratio is not an integer ratio but instead is derived from the transfer characteristics of nonlinear active elements (usually FETs) used in the circuitry. In such a system, the transfer characteristics of the nonlinear active elements may vary from element to element and especially with circuits that are physically separated and operating under varying temperature conditions. The compression and expansion ratio of such circuits will, of course, vary from compressor to expander producing companding errors in the system.

Figure 5:
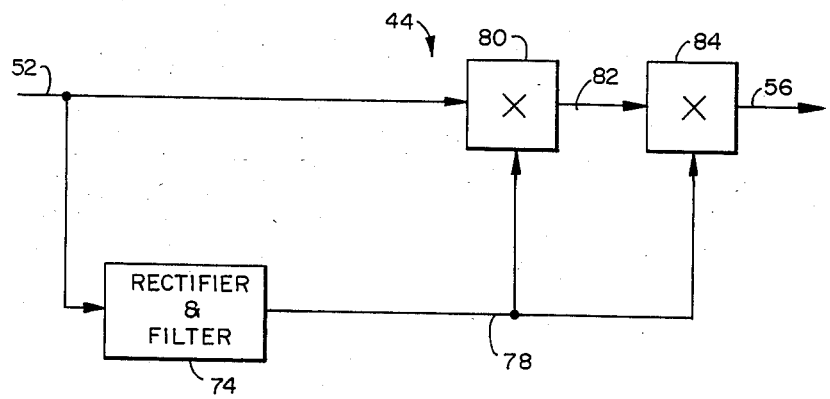
FIG. 5 is a block diagram of an integer (1:3) expander circuit used in the composite expanders of FIGS. 1, 2, and 3.

Integer compressors and expanders, as shown in FIGS. 4 and 5, will overcome the shortcomings of compandors which rely on the transfer functions of the nonlinear active elements. The integer compressor is shown in block diagram form in FIG. 4 and the integer expander is shown in block diagram form in FIG. 5. Both the compressor of FIG. 4 and the expander of FIG. 5 can be implemented by the circuitry shown in schematic form in FIGS. 6A and 6B with the minor changes which will be described below.

Returning to FIG. 4, there is shown in block diagram form an integer compressor 26 such as that used in composite compressor 12. Integer compressor 26 is the same in configuration as the integer compressors identified by the reference numerals 26, 28, and 48 in FIG. 1. The compressor 26 in FIG. 4 includes two divider circuits 62 and 64 and a divisor feedback loop 66 including a rectifier and filter 68. With continuing reference to FIG. 4 and FIG. 1, the input signal on line 34 to the integer compressor 26 is, for example, the high frequency component of the audio analog signal. The input signal on line 34 is connected to dividend terminal of divider circuit 62 and is arithmetically divided by the value of divisor signal on line 66 of the divisor feedback loop. The quotient of the divider circuit 62 produced on line 72 is then divided again in divider circuit 64 by the divisor signal on line 66. The quotient produced on line 38 by divider circuit 64 is the output signal of integer compressor 26 and is used to generate the divisor signal on line 66. As a result, the amplitude of the output signal on line 38 is the equal to the cube root of the amplitude of the input signal on line 34.

In order to generate the divisor signal on line 66, the output signal on line 38 (the cube root of the amplitude of the input signal) is rectified and filtered by the rectifier and filter 68. The divisor signal (line 66) is thus the rectified, d.c. value of the compressor output amplitude. The compressor 26 thus produces an output amplitude which is the cube root of the input amplitude. The resulting transfer function expressed in db provides an integer 3:1 compression ratio.

Turning to FIG. 5, an integer expander such as 44 shown in FIG. 1 is shown in block diagram form. The input signal on line 52 is, for example, the compressed high frequency component of the compressed analog signal. The instantaneous amplitude of that signal on line 52 is rectified and filtered by rectifier and filter 74 to produce a multiplier signal on line 78, which is the rectified and linearized d.c. value of the input signal on line 52. The first multiplier circuit 80 multiplies the instantaneous amplitude of the compressed high frequency component at input 52 by itself (the multiplier signal on line 78) to produce the square of the amplitude of the high frequency component on line 82. The second multiplier circuit 84 then multiplies that product on line 82 again by the instantaneous amplitude of the multiplier signal on line 78 which produces the cube of the amplitude of the compressed analog signal on line 56. As a result, it is apparent that the integer expander 44 generates the cubed amplitude of the input at its output for each amplitude at its input or expressed in db provides a 1:3 expansion ratio.

As can be readily understood from the description of the integer compressor in FIG. 4 and the integer expander in FIG. 5, the compression and expansion ratio is determined by the number of divider circuits for compression or the number of multiplier circuits for expansion. Thus the integer compressor 26 and the integer expander 44 provide a set, repeatable integer companding ratio.

Figure 6A:
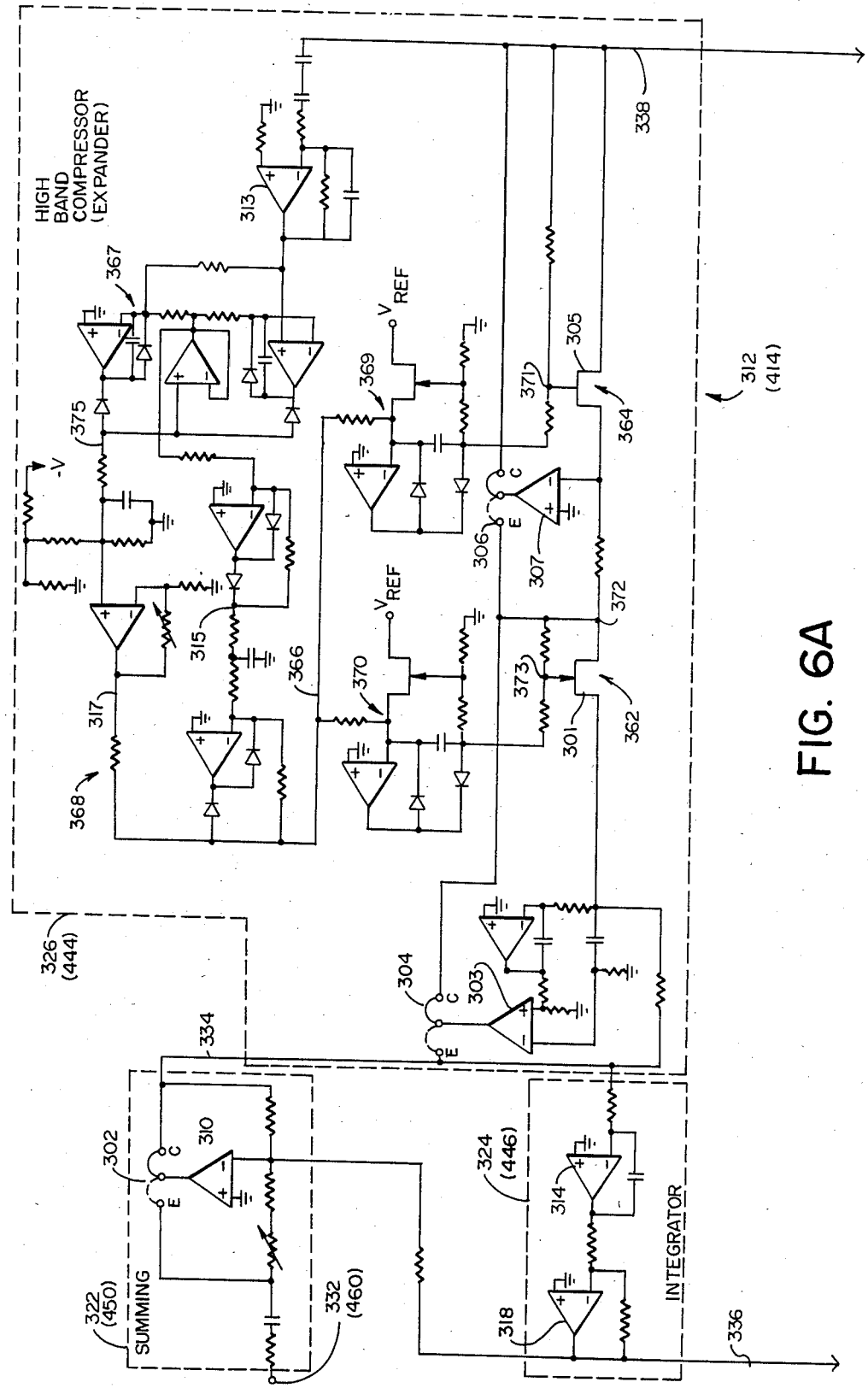
FIGS. 6A and 6B together show an electrical schematic for the congruent composite compressor and composite expander.
Figure 6B:
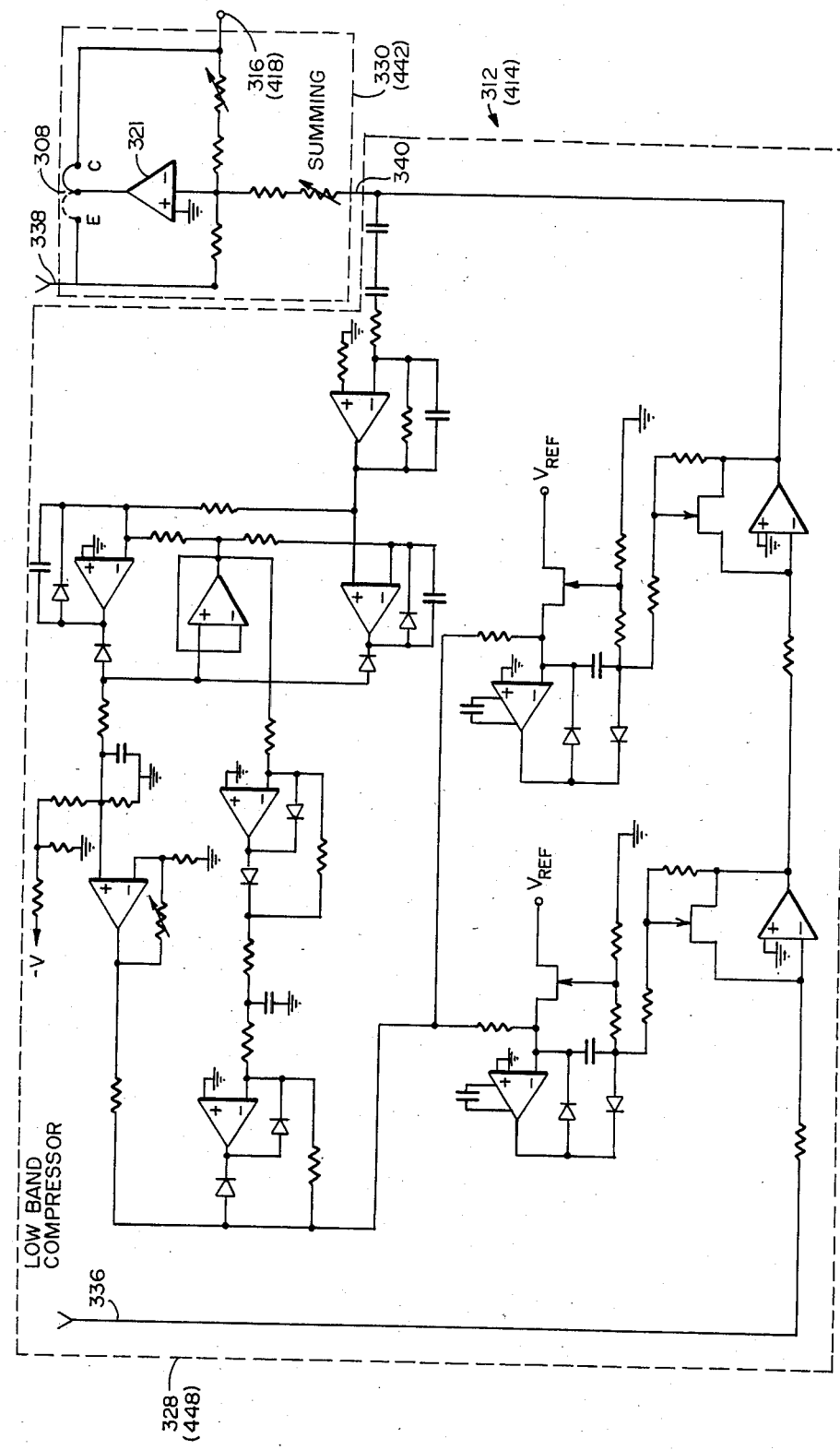

In order to implement the block diagram of the compandor shown in FIG. 1, FIGS. 6A and 6B show an electronic circuit schematic which with only minor changes can be used for both the composite compressor 12 and the composite expander 14. The ability to use a circuit which is essentially the same for both the composite compressor and the composite expander is an important feature of the present invention in view of the obvious savings in manufacturing and inventory costs for such a system.

In describing the circuitry in FIGS. 6A and 6B, two sets of reference numerals will be used. Reference numerals in the 300 series will be used to describe the operation of the circuitry as a composite compressor and numerals in the 400 series will be used to describe the operation of the circuitry as a composite expander. Moreover, the last two digits for both the compressor and expander will correspond to the digits used in FIG. 1 to identify similar components.

Turning then to FIGS. 6A and 6B, there is shown a composite compressor 312 comprising an input summing circuit 322, an integrator 324 in a feedback loop, a 3:1 integer high band compressor 326, a 3:1 integer low band compressor 328, and an output summing circuit 330. An analog signal such as a normal audio signal is connected to input 332 of the composite compressor 312, and the compressed analog signal is available at output 316 from the composite compressor.

In order to implement the composite compressor 312 from the circuitry shown in FIG. 6, jumpers at positions 302, 304, 306, and 308 are connected from their center taps to the "c" position. In order to implement the composite expander 414 from the circuitry shown in FIG. 6, jumpers 302, 304, 306, and 308 are connected from their center taps to the "e" position. As a result, one of ordinary skill in the art can readily appreciate that the circuitry shown in FIG. 6 can be modified to be used either as a composite compressor 312 or a composite expander 414 by simply moving the jumpers 302, 304, 306, and 308.

With regard to the operation of composite compressor 312, an analog signal is connected to input 332 of the input summing circuit 322. The analog signal for the purposes of this discussion is assumed to be an audio analog signal having a full audio frequency spectrum. In the summing circuit 322, the high frequency component of the analog signal is extracted from the analog signal by subtracting the low frequency component (line 336) from the analog signal. The extracted high frequency component on line 334 is then integrated by means of integrator 324 which includes amplifiers 314 and 318 connected in conventional fashion to configure an analog signal integrator.

The output of amplifier 318 on line 336 is the integral of the high frequency component of the analog signal and is therefore the low frequency component of the analog signal. As previously described, that low frequency component on line 336 is used in the summing circuit 322 to extract the high frequency component from the full spectrum analog signal in the first instance.

Once the high and low frequency components of the analog signal have been isolated on lines 334 and 336 respectively, both signals are compressed in parallel by identical 3:1 integer compressors 326 (high band, FIG. 6A) and 328 (low band, FIG. 6B). Referring to the high band integer compressor 326 (FIG. 6A), the high band integer compressor 326 comprises two series connected divider circuits 362 and 364 and a divisor feedback loop 366 which includes a rectifier 367 and a dual speed filter 368.

In the integer high band compressor, the high frequency component of the analog signal on line 334 is fed to the first divider 362 which comprises FET 301, operational amplifier 303, and linearizer 370. As will become apparent, the signal on line 366 is the divisor signal, which is the rectified, d.c. value of the output (line 338) of integer compressor 326. The FET 301 in conjunction with linearizer 370 which compensates for any non-linearity in FET 301 arithmetically divides the value of the high frequency component on line 334 (the dividend terminal) by the divisor signal on line 366 (the divisor terminal) to produce the quotient of that division at line 372. The quotient on line 372 is arithmetically divided again by dividing circuit 364 which comprises FET 305, operational amplifier 307, and linearizer 369. Again the value of the divisor on line 366 is the rectified, d.c. value of the output (line 338) of the high band integer compressor 326. As a result of the arithmetic division carried out by dividing circuits 362 and 364, the amplitude of the output of the integer compressor on line 338 is the cube root of the amplitude of the input signal on line 334 and represents a 3:1 compression of the high frequency component of the analog signal.

The output of integer compressor 326 on line 338 is used in feedback loop 366 to generate the divisor signals on lines 373 and 371. The compressed high frequency component on line 338 is first amplified by means of amplifier 313 and then rectified by means of rectifier 367 to produce a d.c. voltage (on line 375) which is proportional to the instantaneous peak value of the a.c.

voltage on output line 338. The rectified signal (line 375) is connected through dual speed filter 368 which has a fast path 315 and a slow path 317. The fast path 315 passes sudden bursts of signal from the rectifier, and after a few milliseconds of sustained tone, the slow path which has a greater gain takes over. The dual speed filter 368 allows fast transients to be handled without clipping and slowly changing wave forms to be handled with low distortion. The particular configuration of the dual filter 368 shown in FIG. 6 switches speeds on the basis of a ratio error or difference between the two paths rather than on the basis of a fixed voltage error and is therefore much more effective at low levels of signal.

A person of ordinary skill in the art can appreciate that the integer low band compressor 328 (FIG. 6B) operates in the same fashion as the integer high band compressor just described and compresses the low frequency component (line 336) to produce the compressed low frequency component (line 340).

The low and high frequency components in compressed form on lines 338 and 340 are then summed by means of operational amplifier 321 (FIG. 6B) which is part of the summing circuit 330. The output of operational amplifier 321 is connected via jumper 308 in the "c" position to the output 316 of the composite compressor 312. The signal at output 316 is the sum of the two compressed frequency components and is therefore the 3:1 compressed audio signal.

The composite expander is constructed by switching jumpers 302, 304, 306, and 308 to the "e" position thereby changing integer high band compressor 326 to integer high band expander 444. It should also be appreciated that the composite expander 414 is simply the mirror image (left to right in FIGS. 6A and 6B) of the composite compressor just described. Therefore, the input to the composite expander is input 418 on which the composite expander 414 receives the compressed audio signal from the transmission medium and line 460 is the original analog output signal. The other basic components for the composite expander 414 are identified by 400 series reference numerals (having the last two digits the same as those referenced numerals used in FIG. 1) to identify the basic components. For example, the composite expander 414 comprises input summing circuit 442 (FIG. 6B), integer high band expander 444 (FIG. 6A), integer low band compressor 448 (FIG. 6B), integrator 446 (FIG. 6A), and output summing circuit 450 having an output terminal 460 (FIG. 6A). It will also be appreciated by one of ordinary skill in the art that in the integer high band expander 444, the FETS 305 and 301 now operate as multiplier circuits with the jumpers 306 and 304 connected to the "e" positions. Aside from those identified differences, the circuitry for the composite expander 414 operates the same as the circuitry for the composite compressor 312.

The compandor 10 shown in FIG. 1 divides the analog signal into two frequency bands, a high band and a low band. A second order frequency function can give better compandor performance for music signals by improving the rejection of low frequency components in the high band. There are basically three reasons why the improvement provided by a second order frequency function is of importance. First, for psophometric reasons, noise rejection in the high band is especially important. Second, due to the characteristics of music, very little audio power is present in the high band. This situation allows a large potential noise reduction by using the compandor to increase the transmitted power in the high band. Third, compandors with first order band splits, such as that shown in FIG. 1, are limited in high band noise rejection by the typical music power concentration at frequencies outside of the high band. As a result, high band music power may be swamped by the leakage of high level low frequency components through the limited rejection of the first order high pass filter (integrator 24 and summing circuit 22 of FIG. 1).

Figure 2:
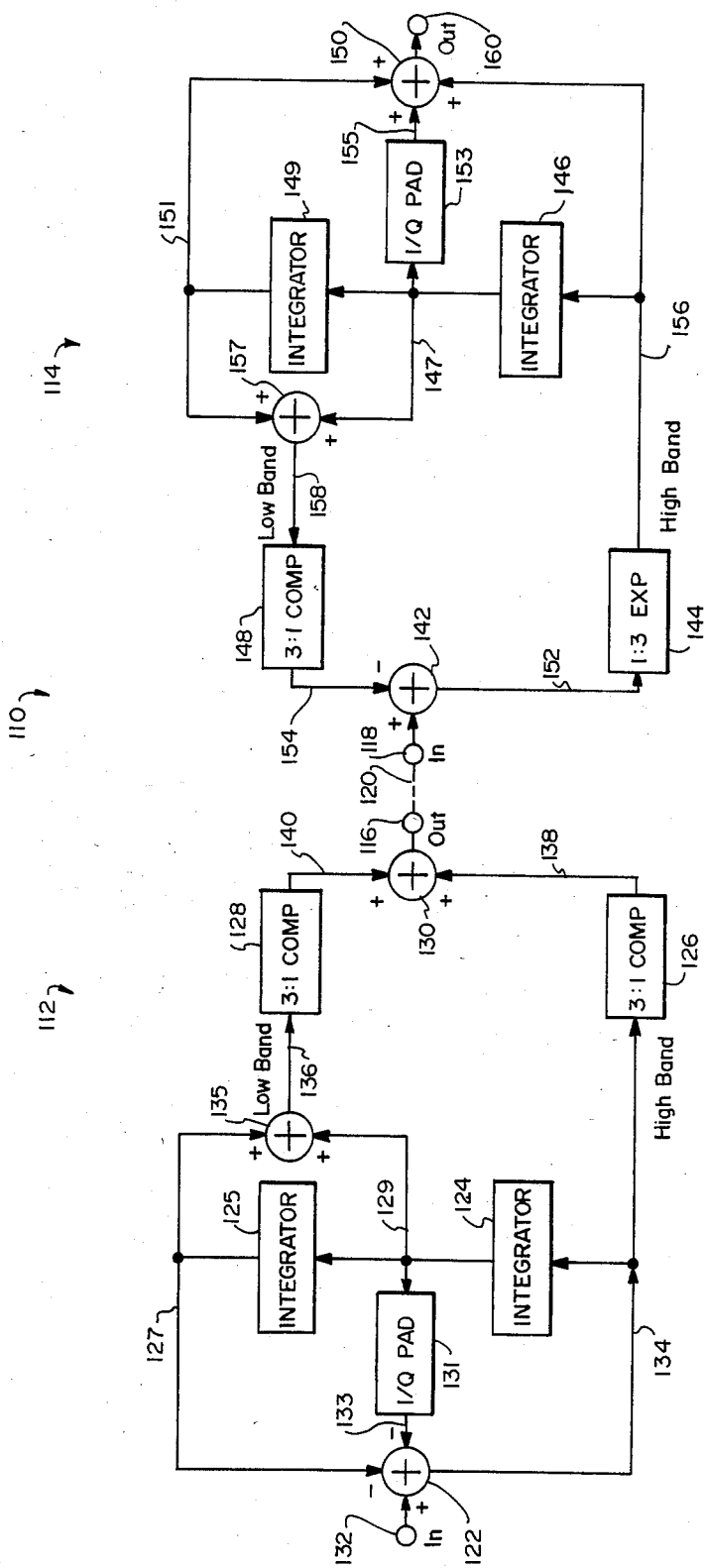
FIG. 2 is a block diagram of an alternative two frequency band compandor with a second order band split filter.
Figure 3:
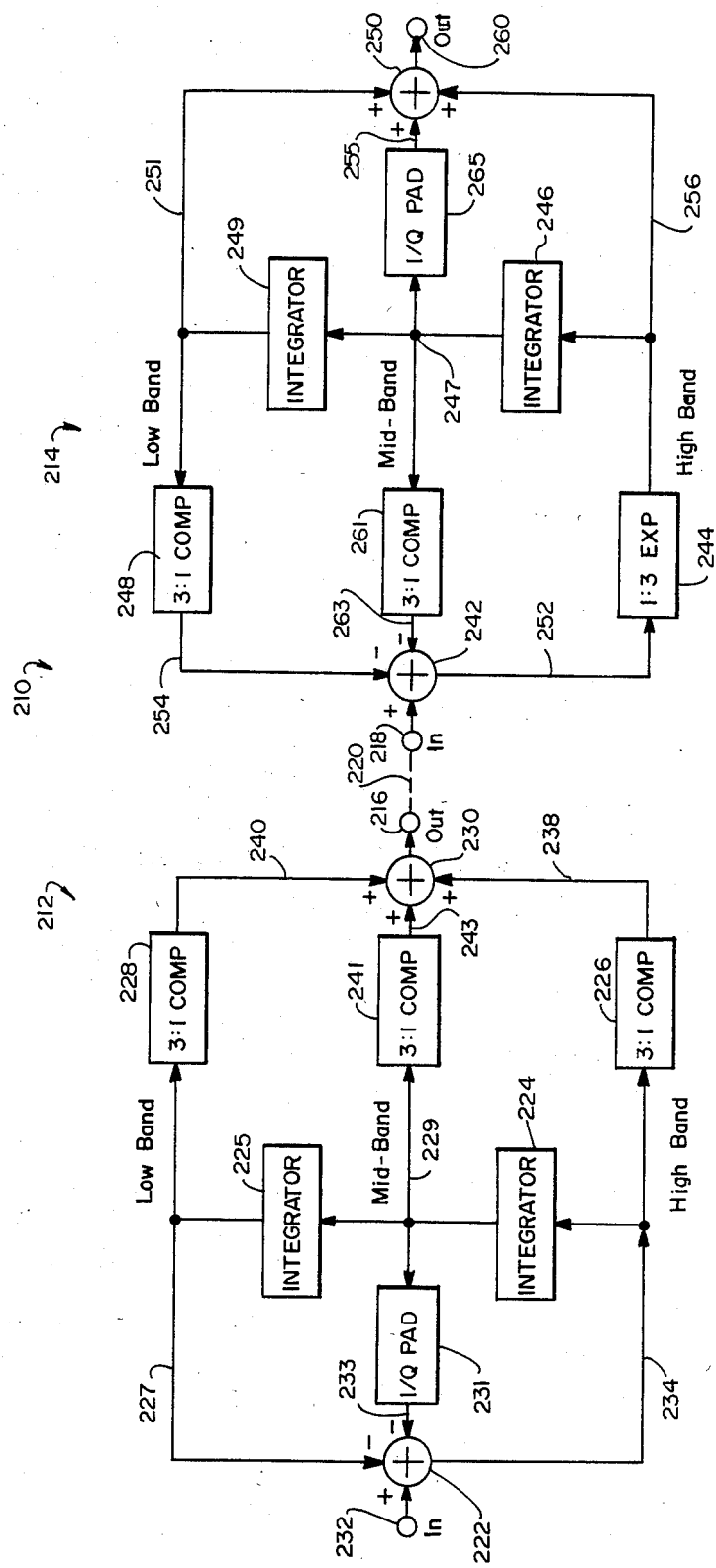
FIG. 3 is a block diagram of an alternative three frequency band compandor with a second order band split filter.

In order to provide improved performance, a two band compandor 110 with a second order band split filter is shown in FIG. 2, and a three band compandor 210 with a second order band split is shown in FIG. 3.

Turning to FIG. 2, the compandor 110 comprises a composite compressor 112 and a composite expander 114. The composite compressor 112 is connected to the transmit end 116 of a transmission medium 120, and the composite expander 114 is connected to the receive end 118 of the transmission medium 120.

The second order composite compressor 112 has an input summing circuit 122 which extracts the high frequency component (line 134) from the analog signal (at input 132) by subtracting a low band frequency component (line 127) and an attenuated mid-range frequency component (line 133) from the analog signal. The integrator 124 integrates the high frequency component on line 134 and produces the mid-range frequency component of the analog signal on line 129, and integrator 125 produces a low band frequency component of the analog signal on line 127. The mid-range frequency component on line 129 is connected to attenuator 131 having a gain of 1/Q where Q is the quality factor of the second order feedback loop. The attenuated mid-range frequency component is connected from attentuator 131 to summing circuit 122 by line 133. The attentuated mid-range frequency component on line 133 and the low frequency component on line 127 are then subtracted from the analog signal on line 132 to provide the high frequency component signal on line 134 as previously described.

The mid-range frequency component (line 129) and the low frequency component (line 127) are combined by means of summing circuit 135 to produce a composite mid-range and low band frequency component on line 136. The composite mid-range and low band frequency component of the analog signal (line 136) and the high frequency component (line 134) of the analog signal are compressed in parallel by identical 3:1 integer compressors 128 and 126 respectively to produce a compressed high frequency component on line 138 and a compressed composite low band frequency component on line 140. The compressed high frequency component and the compressed composite low band frequency component are summed by output summing circuit 130 to yield a compressed analog signal at output 116 which is connected through conventional modulators and transmitters (not shown) to the transmission or recording medium 120.

At the composite expander 114, the various frequency components produced in the composite compressor 112 are recreated in the congruent structure of the composite expander 114. The compressed analog signal is received at the receive end 118 of the transmission medium 120 and is connected to the input summing circuit·142. The input summing circuit 142 extracts the compressed high frequency component (line 152) from the compressed analog signal (at input 118) by subtracting the compressed composite low band frequency component (line 154) from the compressed analog signal. The compressed high frequency component (line 152) is then expanded by an integer 1:3 expander 144 to produce the expanded high frequency component of the analog signal on line 156. The expanded high frequency component on line 156 is then integrated by integrator 146 to produce the mid-range frequency component of the analog signal on line 147. The mid-range frequency component on line 147 is integrated again by integrator 149 to produce the low frequency component of the analog signal on line 151. The mid-range frequency component on line 147 is then attenuated by attenuator 153 having a gain of 1/Q, where Q again is the quality factor of the second order feedback loop, to produce an attentuated mid-range frequency component at line 155. The mid-range frequency component on line 147 and the low frequency component on line 151 are summed by means of summing circuit 157 to produce an expanded composite low band frequency component on line 158. The expanded composite low band frequency component at line 158 is then compressed by means of a 3:1 integer compressor 148 to produce the compressed composite low band frequency component on line 154, which is in turn used at input summing circuit 142 to extract the compressed high band frequency component on line 152 as previously described.

In order to reconstruct the original analog signal at output 160, the amplified mid-range frequency component on line 155, the low frequency component on line 151, and the high frequency component on line 156 are summed by means of output summing circuit 150.

Turning to FIG. 3, there is shown a three band compandor 210 comprising a composite compressor 212 and a composite expander 214. The composite compressor 212 is connected to the transmit end 216 of a transmission medium 220, and the composite expander 214 is connected to the receive end 218 of the transmission medium 220.

The composite compressor 212 has an input summing circuit 222 which extracts the high frequency component (line 234) from the analog signal (at input 232) by subtracting a low frequency component line 227) and a mid-range attenuated frequency component (line 233) from the analog signal at input 232.

The high frequency component signal on line 234 is integrated by integrator 224 to produce a mid-range frequency component on line 229 which is in turn integrated by integrator 225 to produce a low frequency component of the analog signal on line 227. The mid-range frequency component (line 229) is then attenuated by attenuator 231 having a gain of 1/Q where Q is the quality factor of the feedback loop. The three band frequency components on lines 234, 229, and 227 are each fed to parallel connected 3:1 integer compressors 226, 241, and 228 respectively to produce compressed high band, mid-band, and low band frequency components on lines 238, 243, and 240, respectively.

The compressed three band frequency components are then summed by output summing circuit 230 to produce a composite compressed analog output signal at output 216 which is then connected to the transmission or recording medium 220 by conventional modulators and transmitters (not shown).

The compressed analog signal at receive end 218 of the transmission medium 220 is connected to summing circuit 242 of composite expander 214. Input summing circuit 242 extracts the compressed high frequency component (line 252) from the compressed analog signal (at input 218) by subtracting the compressed mid-range frequency component (line 263) and the compressed low frequency component (line 254) from the compressed analog signal. The compressed high frequency component of the compressed analog signal (line 252) is then expanded by 1:3 integer expander 244 to produce the expanded high frequency component of the analog signal on line 256. The expanded high frequency component of the analog signal on line 256 is integrated by integrator 246 to produce the expanded mid-range frequency component of the analog signal on line 247, which is in turn integrated by integrator 249 to produce the expanded low frequency component of the analog signal on line 251.

Both the expanded mid-range frequency component (line 247) of the analog signal and the expanded low frequency component (line 251) of the analog signal are compressed by identical 3:1 integer compressors 261 and 248, respectively to produce the compressed mid-range frequency component (line 263) of the analog signal and the compressed low frequency component (line 254) of the analog signal which are used as previously described to extract the compressed high frequency component from the compressed analog signal by means of a summing circuit 242.

The expanded mid-range frequency component (line 247) of the analog signal is attenuated by attenuator 265 having a gain of 1/Q, where Q is the quality factor of the feedback loop, to produce the amplified expanded mid-range frequency component (line 255). The original analog signal is reconstructed by summing the expanded high frequency component on line 256, the attenuated expanded mid-range frequency component on line 255, and the expanded low frequency component on line 251 by means of output summing circuit 250.

I claim:

1. A compandor for improving transmission of an analog signal on a transmission medium by overcoming noise in the transmission medium comprising:
   a. composite compressor means having a compressor input for receiving the analog signal and a compressor output connected to the transmission medium, the composite compressor including:
      i. compressor input summing circuit means and compressor frequency selective means connected in feedback relationship for dividing the analog signal into at least two uncompressed frequency components:
      ii. integer compressor means connected to the compressor input summing circuit means and compressor frequency selective means for receiving each of the uncompressed frequency components of the analog signal and for compressing in parallel each uncompressed frequency component of the analog signal by an integer compression ratio to produce compressed frequency components of the analog signal; and
      iii. compressor output summing circuit means connected to the integer compressor means for combining the compressed frequency components of the analog signal to produce a compressed analog signal at the output of the composite compressor means; and
   b. composite expander means having an expander input connected to the transmission medium and an expander output, the composite expander including:

i. feedback loop for separating the compressed analog signal received from the transmission medium into compressed frequency components that correspond to the compressed frequency components of the analog signal found in the composite compressor and for deriving uncompressed frequency components that correspond to the uncompressed frequency components found in the composite compressor, the feedback loop comprising:

(a) expander input summing circuit means for receiving the compressed analog signal and extracting a first compressed frequency component from the compressed analog signal;

(b) integer expander means connected to the expander input summing circuit means for expanding the extracted first compressed frequency component by an integer expansion ratio to produce a first uncompressed frequency component of the anaalog signal;

(c) expander frequency selective means connected to the integer expander means for deriving from the first uncompressed frequency component the other uncompressed frequency components of the analog signal; and (d) integer compressor means connected to the frequency selective means for compressing each of the other uncompressed frequency components to produce compressed frequency components which are connected via the feedback loop to the expander input summing circuit means and are used for extracting the extracted first compressed frequency component; and ii. expander output summing circuit means connected to the feedback loop for combining the uncompressed frequency components of the analog signal to reproduce the analog signal.

2. The compander of claim 1, wherein the integer compressor means comprises an input, an output, discrete arithmetic dividing circuit means having a dividend terminal, a divisor terminal, and a quotient terminal, and divisor feedback loop which provides a divisor signal by connecting the integer compressor's output to the divisor terminal of the dividing circuit means.

3. The compandor of claim 2, wherein the integer compression ratio is 3:1, and the integer compressor means comprises two arithmetic dividing circuit means.

4. The compander of claim 2, wherein the divisor feedback loop includes rectifier, dual speed filter, and linearizer, wherein the dual speed filter comprises a fast path for passing sudden bursts of the divisor signal and a slow path having a greater gain than the fast path, which slow path takes over transmission of the divisor signal after a predetermined time.

5. The compandor of claim 1, wherein the integer expander means comprises an input, an output, discrete arithmetic multiplication means having a multiplicand terminal, a multiplier terminal, and a product terminal, and multiplier feedforward loop which provides a multiplier signal by connecting the integer expanders input to the multiplier terminal of the multiplication means.

6. The compandor of claim 4, wherein the integer expansion ratio is 1:3, and the integer expander means comprises two arithmetic multiplication circuit means.

7. The compandor of claim 5, wherein the multiplier feed forward loop includes a rectifier, dual speed filter, and linearizer, wherein the dual speed filter comprises a fast path for passing sudden bursts of the multiplier signal and a slow path having a greater gain than the fast path which slow path takes over transmission of the multiplier signal after a predetermined time.

8. A method for improving transmission of an analog signal having a frequency spectrum by overcoming noise in a transmission medium comprising:

a. splitting the analog signal into at least two uncompressed frequency components;

b. compressing each frequency component by an integer compression ratio and in parallel;

c. combining the compressed frequency components to produce a compressed analog signal;

d. transmitting the resulting compressed analog signal on the transmission medium;

e. receiving the compressed analog signal from the transmission medium;

f. extracting a first compressed frequency component of the compressed analog signal from the compressed analog signal which extracted first compressed frequency component corresponds to one of the compressed frequency components available prior to combining the compressed frequency component;

g. expanding the extracted first compressed frequency component by an integer expansion ratio corresponding to the integer compression ratio to produce a first uncompressed frequency component;

h. deriving other uncompressed frequency components from the extracted first uncompressed frequency component which other uncompressed frequency components correspond to all but one of the uncompressed frequency components that resulted from splitting the analog signal;

i. compressing the other uncompressed frequency components by an integer compression ratio corresponding to the first mentioned integer compression ratio to provide other compressed frequency components for use in extracting the first compressed frequency component;

j. combining the uncompressed frequency components to reconstruct the analog signal.

9. The method of claim 8 wherein the compression ratio is 3:1 and the expansion ratio is 1:3.

10. In a compandor circuit for improving transmission of an analog signal on a transmission medium by overcoming noise in the transmission medium, a composite compressor comprising:

a. an input for receiving the analog signal and an output connected to the transmission medium;

b. input summing circuit means and compressor frequency selective means connected in feedback relationship for dividing the analog signal into at least two uncompressed frequency components;

c. integer compressor means connected to the input summing circuit means and frequency selective means for receiving each of the uncompressed frequency components of the analog signal and for compressing in parallel each uncompressed frequency component of the analog signal by an integer compression ratio to produce compressed frequency components of the analog signal; and d. output summing circuit means connected to the integer compressor means for combining the compressed frequency components of the analog signal to produce a compressed analog signal at the output of the composite compressor.

11. The composite compressor of claim 10, wherein the integer compressor means comprises an input, an output, discrete arithmetic dividing circuit means having a dividend terminal, a divisor terminal, and a quotient terminal, and divisor feedback loop which provides a divisor signal by connecting the integer compressor's output to the divisor terminal of the dividing circuit means.

12. The composite compressor of claim 11, wherein the integer compression ration is 3:1, and the integer comprssor means comprises two arithmetic dividing circuit means.

13. The composite compressor of claims 11, wherein the divisor feedback loop includes rectifier, dual speed filter, and linearizer, wherein the dual speed filter comprises a fast path for passing sudden bursts of the divisor signal and a slow path having a greater gain than the fast path, which slow path takes over transmission of the divisor signal after a predetermined time.

14. In a compandor circuit for improving transmission of an analog signal on a transmission medium by overcoming noise in the transmission medium, a composite expander comprising:
 a. input connected to the transmission medium for receiving a compressed analog signal and an output;
 b. feedback loop connected to the input for separating the compressed analog signal into compressed frequency components that correspond to the compressed frequency components of the analog signal and for deriving uncompressed frequency components, the feedback loop comprising:
  (i) input summing circuit means for receiving the compressed analog signal and extracting a first compressed frequency component from the compressed analog signal;
  (ii) integer expander means connected to the input summing circuit means for expanding the extracted first compressed frequency component by an integer expansion ratio to produce a first uncompressed frequency component of the analog signal;
  (iii) frequency selective means connected to the integer expander means for deriving from the first uncompressed frequency component the other uncompressed frequency components of the analog signal; and
  (iv) integer compressor means connected to the frequency selective means for compressing each of the other uncompressed frequency components to produce compressed frequency components which are connected via the feedback loop to the expander input summing circuit means and are used for extracting the extracted first compressed frequency component; and
 c. output summing circuit means connected to the feedback loop for combining the uncompressed frequency components of the analog signal to reproduce the analog signal.

15. The composite expander of claim 14, wherein the integer expander means comprises an input, an output, discrete arithmetic multiplication means having a multiplicand terminal, a multiplier terminal, and a product terminal, and multiplier feedforward loop which provides a multiplier signal by connecting the integer expander means input to the multiplier terminal of the muliplication means.

16. The composite expander of claim 4, wherein the integer expansion ratio is 1:3, and the integer expander means comprises two arithmetic multiplication circuit means.

17. The composite expander of claim 5, wherein the multiplier feed forward loop includes a rectifier, dual speed filter, and, linearizer wherein the dual speed filter comprises a fast path for passing sudden bursts of the multiplier signal and a slow path having a greater gain than the fast path which slow path takes over transmission of the multiplier signal after a predetermined time.

* * * * *